United States Patent [19]
Shirasu

[11] Patent Number: 5,255,972
[45] Date of Patent: Oct. 26, 1993

[54] ELECTROSTRICTIVE EFFECT ELEMENT AND THE PROCESS OF MANUFACTURING THE SAME

[75] Inventor: Tetsuo Shirasu, Tokyo, Japan

[73] Assignee: NEC Corporation, Tokyo, Japan

[21] Appl. No.: 828,161

[22] Filed: Jan. 30, 1992

[30] Foreign Application Priority Data

Jan. 30, 1991 [JP] Japan .................................. 3-009497

[51] Int. Cl.$^5$ .............................................. F01B 29/10
[52] U.S. Cl. .................................... 60/528; 204/180.2
[58] Field of Search ............... 60/527, 528; 204/180.2, 204/180.6, 181.1, 181.5

[56] References Cited

U.S. PATENT DOCUMENTS

| | | | |
|---|---|---|---|
| 4,681,667 | 7/1987 | Utsumi et al. | 204/180.2 X |
| 4,864,824 | 9/1989 | Gabriel et al. | 60/528 X |
| 5,173,162 | 12/1992 | Hagimura et al. | 204/180.2 X |

Primary Examiner—Stephen F. Husar
Attorney, Agent, or Firm—Leydig, Voit & Mayer

[57] ABSTRACT

An internal electrode is printed on one surface of each electrostrictive ceramic green sheet by the screen printing. Two such electrostrictive ceramic green sheets each with an internal electrode layer are laid the electrostrictive ceramic layer of one on the internal electrode layer of the other and rolled together, and then sintered. Subsequently lead wires are soldered to the exposed portions of the corresponding internal electrodes. In virtue of this, small-size, low-voltage driven, highly reliable electrostrictive effect elements can be obtained, and the manufacture of them is very facilitated with the effect of remarkably reducing manufacture cost. In addition the electrostrictive effect element according to the present invention has the capability of radial expansion and contraction about the central axis of the rolled structure and thereby can be applied to new use out of the scope of the prior art.

5 Claims, 3 Drawing Sheets

ELECTROSTRICTIVE EFFECT ELEMENT AND THE PROCESS OF MANUFACTURING THE SAME

BACKGROUND OF THE INVENTION

This invention relates to an electrostrictive effect element, and more particularly to an electrostrictive effect element as actuator in the fields of mechatronics and so on. It also relates to the process of manufacturing such elements.

The electrostrictive effect element is one capable of converting electrical energy into mechanical energy by electrostrictive effect to produce minute, precise mechanical displacement, and generally consists of a material exhibiting electrostrictive effect, such as ceramic, provided with opposite electrodes between which voltage is to be applied.

Preferable electrostrictive effect elements used in the field of mechatronics and so on, are of small-size and capable of producing large displacements at low voltages. So far have been developed the thin film technology for forming a thinner film of electrostrictive material allowing smaller distance between the opposite electrodes required for gaining stronger electric field at the same voltage, and further lamination technique for laminating a plurality of thus-obtained thin electrostrictive effect elements. By application of these, various types of electrostrictive effect elements have been put to practical use.

As an example of such electrostrictive effect element is disclosed in U.S. Pat. No., 4,681,667, a laminated-type electrostrictive effect element which is made by laminating electrostrictive ceramic green sheets and internal electrodes alternately, and then sintering this laminate. All the side faces of every other internal electrode are covered with an insulating material such as glass, and the remaining internal electrodes with side faces exposed are connected to a pair of external electrodes to which a pair of lead wires are soldered. When a voltage is applied to this electrostrictive effect element, adjacent internal electrodes on the opposite sides of each electrostrictive ceramic material work as opposite electrodes to each other, thus displacement being induced in the direction of lamination.

Besides the laminated-type electrostrictive effect element above-mentioned, there is another called stacked-type which is made by sintering discrete electrostrictive ceramic sheets, then laying an internal electrode on both surfaces, respectively, of each sintered sheet, and stacking these into an integrated structure.

These electrostrictive effect elements described above are disadvantageous in high manufacture cost, poor reliability of product, and little promise of large effective displacement. The reasons for these will be set forth under.

Firstly concerning laminated-type electrostrictive effect element: the aforesaid covers of insulating glass material used for insulation are made usually in the process of depositing glass by electrophoretic technique, and then sintered. In association with this, processing steps including formation of tentative electrodes and sintering are needed. Besides such glass deposition cannot carried out at a time on both sides of the laminate, and hence must be done one after the other, for which it takes a longer time. Because of these, it is not easy to increase of product yield.

It is effective for increasing the displacement of electrostrictive effect element to decrease the distance between internal electrodes. Considering the laminated-type electrostrictive effect element, the distance is dependent on the width of the insulating glass cover (referred to as glass insulation hereinafter). By the technique at present, the possible smallest thickness of the electrostrictive ceramic sheet is about 10 $\mu$m while the uniform glass insulation layer can be formed at thicknesses about 40 $\mu$m or more which corresponds by calculation to the thickness of electrostrictive effect material of about 70 $\mu$m. It therefore is impossible to profitably apply the thin film technique of ceramic to above-mentioned structure.

In addition, the insulation capability between external and internal electrodes deteriorates due to movement within the glass insulation layer, of ionized metal derived from external and internal electrodes, and the occurrence and extension of microcracks associated with the displacement induced when in use, and hence the reliability is insufficient.

Concerning the stacked-type electrostrictive effect element, it is difficult to obtain thin uniform electrostrictive ceramic sheets because of occurrence of curve or undulation in the process of sintering discrete electrostrictive ceramic material. Accordingly the minimum value of distance between internal electrodes that can be set is 200 $\mu$m. As compared with the laminated-type electrostrictive effect element, it can responds only with small displacement to impression of the same voltage, i.e. the same displacement is induced only by application of high voltage, which reflects an expensive power supply.

SUMMARY OF THE INVENTION

An electrostrictive effect element according to the present invention consists of at least two electrostrictive ceramic green sheets, each with an internal electrode layer on one surface thereof, and having such structure that they are laid the electrostrictive ceramic layer of each on the internal electrode layer of the adjacent one and rolled together. Then the rolled material is sintered as described earlier to obtain the product. This description characterizes the process of manufacturing the electrostrictive effect element according to the present invention, which, in virtue of the above-mentioned structure, is capable of expanding and contracting radially about the axis of the rolled structure when a high voltage is applied between the opposite electrodes.

DESCRIPTION OF THE PREFERRED EMBODIMENTS

Figure 1:
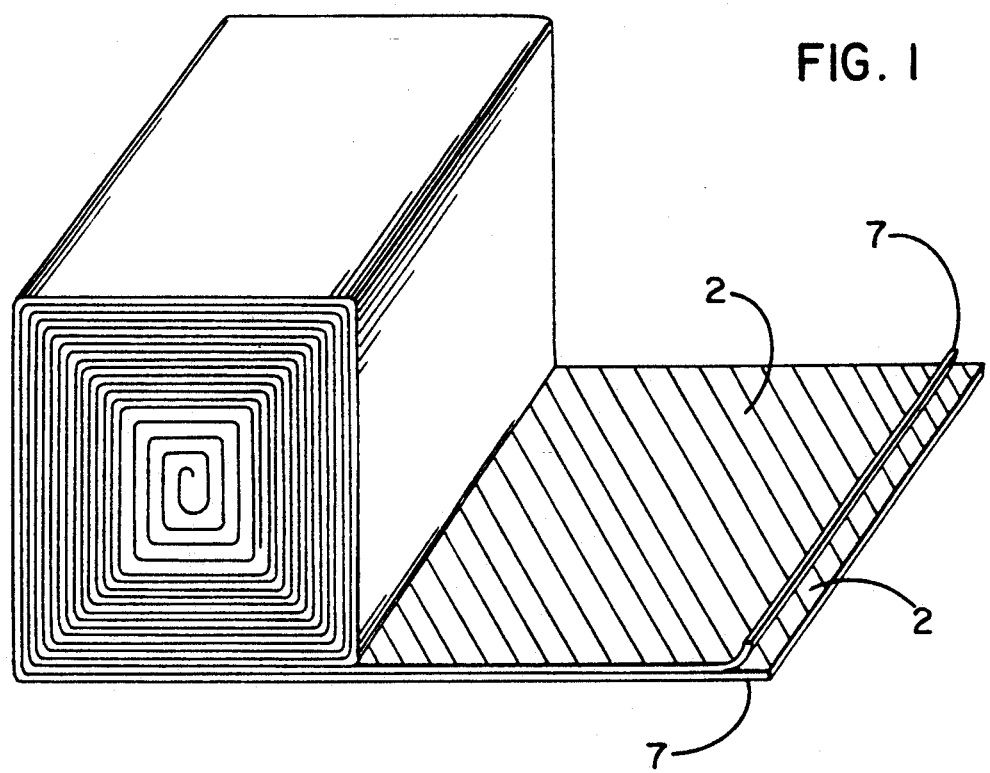
FIG. 1 is a perspective view of the first embodiment of the present invention in the course of rolling.

A preferred embodiment of the present invention will be set forth with reference to the drawings:

An electrostrictive effect element of this embodiment is manufactured as follows: Firstly, a slurry for electrostrictive effect material consisting essentially of such as lead nickel niobate Pb $(Ni_{1/3}Nb_{2/3})O_3$, lead titanate $PbTiO_3$, or lead zirconate $PbZrO_3$ is prepared by the addition of a small amount of organic binder such as polyvinyl butyral to the previously-burned powder of an electrostrictive material as above-mentioned, and dispersion of the mixture in an organic solvent such as ethyl cellosolve.

The obtained slurry is formed into electrostrictive ceramic green sheets 7 of about 25 μm in thickness, for example, by the slip casting technique for forming film.

Each electrostrictive ceramic green sheet 7 is coated over its one surface with a conducting paste to a thickness of about 6 μm by the screen printing method, and thus an internal electrode 2 is formed. Conducting pastes are suitable for use which contains as major component, such as a mixture of silver powder 7 parts and palladium powder 3 parts, or alloy powders from these.

Subsequently two such coated electrostrictive ceramic green sheets 7 are laid the electrostrictive ceramic layer of one of the internal electrode layer of the other, and tightly rolled together as shown in FIG. 1.

Figure 2:
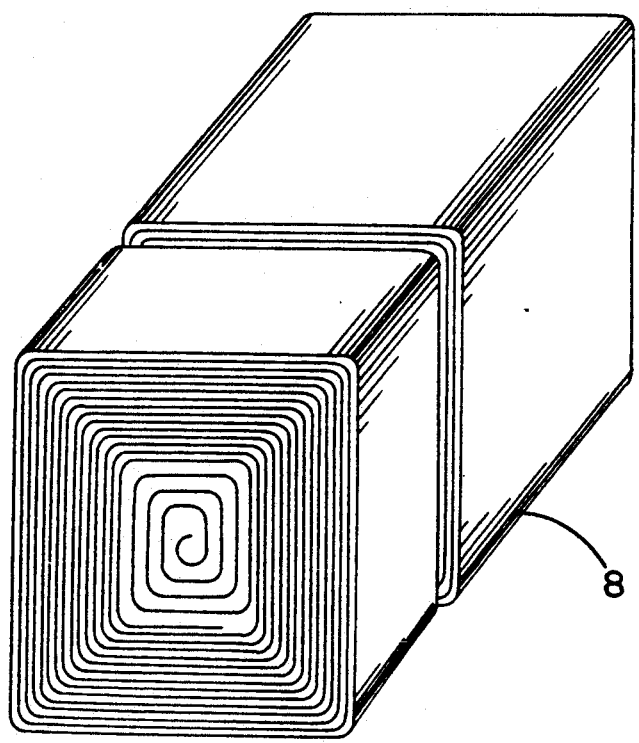
FIG. 2 is a perspective view of the first embodiment of the present invention partially sliced after having rolled-together.

Then, the obtained rolled material is sintered at 1100° C. for two hours to obtain a sintered body 8 though shown in partially sliced way of FIG. 2 for later description.

Before being sintered, it may be placed in a metal mold and subjected to thermocompaction into a good shape if desired.

Figure 3:
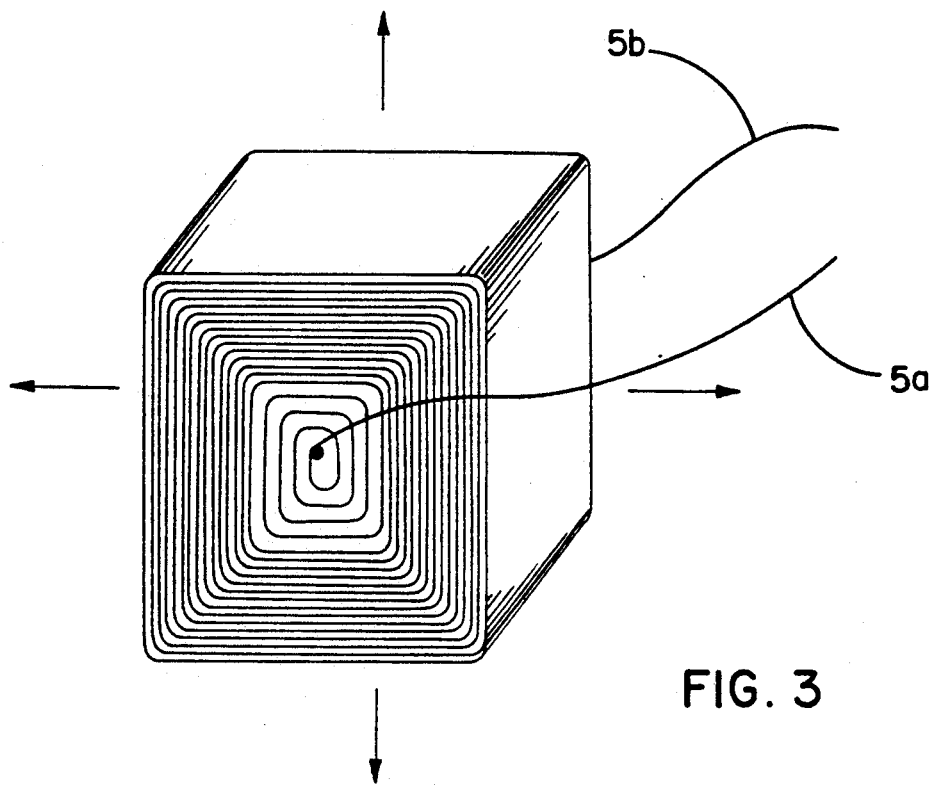
FIG. 3 is a perspective view of the first embodiment of the present invention as final product.

The sintered body 8 is sliced to a desired thickness with a wire saw, and the two continuous internal electrode 2 of each slice are soldered in place of their exposed portions, respectively, to lead wires 5a and 5b, respectively. A final product or electrostrictive effect element is shown in FIG. 3.

Figure 4:
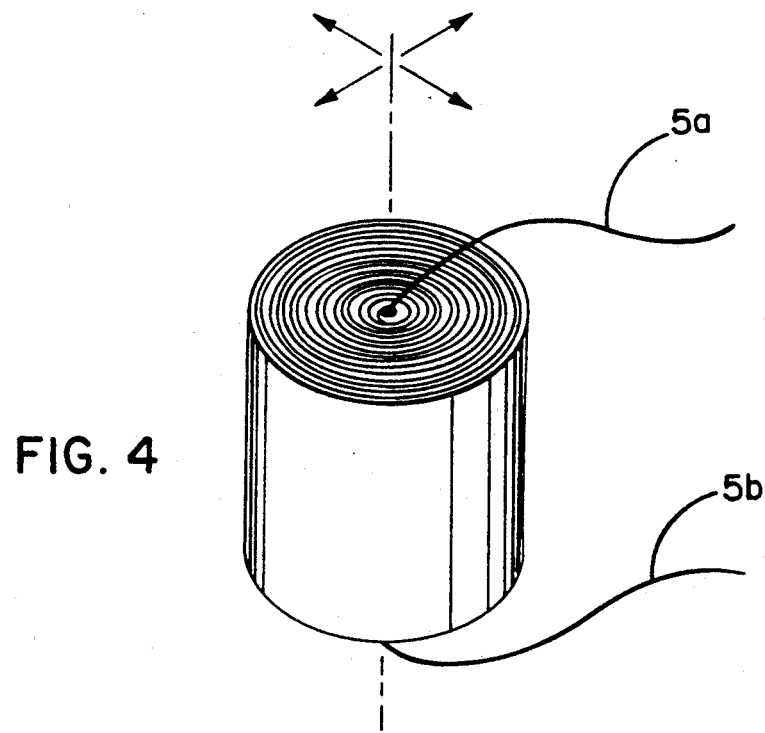
FIG. 4 is a perspective view of the second embodiment of the present invention as final product.
Figure 5:
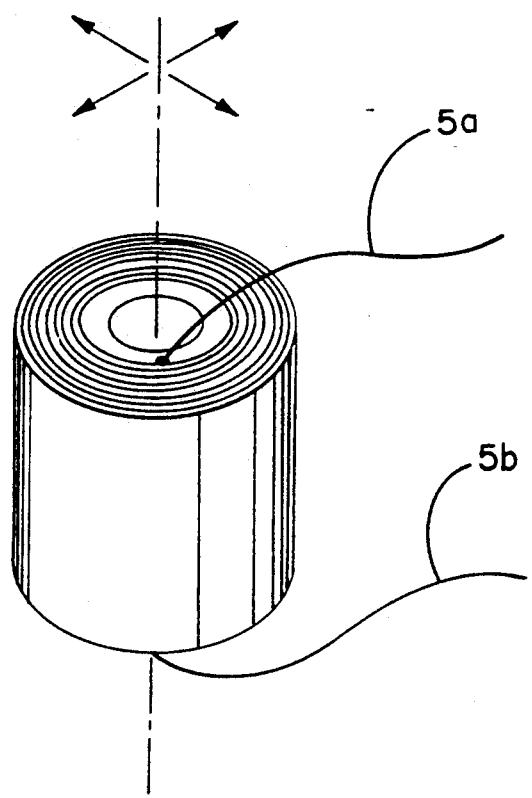
FIG. 5 is a perspective view of the third embodiment of the present invention as final product.

As apparent from the above-described, the cross-section of the electrostrictive effect elements according to the present invention is not restricted to square or rectangle but their shapes may be, for example, columnar or cylindrical as shown in perspective view in FIGS. 4 or 5.

For the electrostrictive effect elements of various shapes, lead wires can be connected directly to the internal electrodes. This makes external electrodes unnecessary, which are needed for the prior art laminated-type electrostrictive effect element as intermediary between the internal electrodes and lead wires, and in turn or glass insulations between external and internal electrodes are needed, too.

To application of an external voltage between lead wires 5a and 5b, the electrostrictive effect element according to the present invention responds with radial displacement about its central axis as shown by arrows in Figures involved, respectively. This is one of the remarkable advantages of it over the prior art electrostrictive effect element capable of the responding with displacement in one direction only.

As described above, the electrostrictive effect elements according to the present invention which are made by rolling together electrostrictive ceramic green sheets, each with an internal electrode thereover, and then sintering the rolled material, and in virtue of this structure no glass insulations between external and internal electrodes is needed while the electrostrictive effect element in the prior art needs them. Thus much simplification of structure and manufacture process has been achieved.

In other words the distance between the internal electrodes in the electrostrictive effect element according to the present invention is unaffected by the technique of forming glass insulations and dependent on the thickness of the electrostrictive ceramic green sheet. The distance therefore can be smaller than in the prior art electrostrictive effect element by forming a smaller thickness of the electrostrictive ceramic green sheet by the conventional thin film technology. In addition the integration by subsequent sintering is possible, which permits the thickness of the electrostrictive ceramic green sheet to be as small as that of the laminated-type ceramic capacitor in the prior art.

The present invention therefore can provide small-size, low-voltage driven electrostrictive effects elements having high reliability.

Besides the present invention can much facilitate the manufacture of electrostrictive effect elements, with the effect of remarkably-reduced manufacture cost. The capability of radial expansion and contraction about the central axis of the rolled structure provides expectation to new use out of the scope of the prior art.

What is claimed is:

1. An electrostrictive effect element comprising: a first electrostrictive effect ceramic sheet with a first conductor layer on one surface thereof, and a second electrostrictive effect ceramic sheet with a second conductor layer on one surface thereof, said first and second electrostrictive effect elements being laid one on the other and rolled together to electrically isolate said conductor layers from each other to form a rolled structure.

2. An electrostrictive effect element according to claim 1, further comprising first and second external leads connected to said first and second conductor layers, respectively, in places thereof near the central axis of said rolled structure.

3. A electrostrictive effect element according to claim 1, wherein said rolled structure has the configuration of a prism.

4. An electrostrictive effect element according to claim 1, wherein said roller structure has the configuration of a column.

5. A process of manufacturing an electrostrictive effect element comprising: a step of making a first electrostrictive ceramic green sheet with a first conductor layer on one surface thereof and a second electrostrictive effect ceramic green sheet with a second conductor layer on one surface thereof; a step of laying said first and second electrostrictive ceramic green sheet one on the other and rolling together into such a rolled structure that said first and second conductor layers are placed away from contact with each other; and a step of sintering said roller material.

* * * * *